(12) United States Patent
Lee et al.

(10) Patent No.: US 7,621,998 B2
(45) Date of Patent: Nov. 24, 2009

(54) SINGLE CRYSTALLINE GALLIUM NITRIDE THICK FILM HAVING REDUCED BENDING DEFORMATION

(75) Inventors: Changho Lee, Seoul (KR); Hyun Min Shin, Seoul (KR); Sun-Hwan Kong, Hwaseong-si (KR); Hae Yong Lee, Gwangmyeong-si (KR)

(73) Assignee: Samsung Corning Co., Ltd. (KR)

( * ) Notice: Subject to any disclaimer, the term of this patent is extended or adjusted under 35 U.S.C. 154(b) by 507 days.

(21) Appl. No.: 11/286,219

(22) Filed: Nov. 23, 2005

(65) Prior Publication Data
US 2006/0108573 A1   May 25, 2006

(30) Foreign Application Priority Data
Nov. 23, 2004   (KR) ............... 10-2004-0096077

(51) Int. Cl.
C30B 23/00 (2006.01)
C30B 28/12 (2006.01)
H01L 29/74 (2006.01)
H01L 21/20 (2006.01)

(52) U.S. Cl. .............. 117/84; 117/82; 117/83; 117/85; 117/86; 117/87; 117/88; 117/92; 117/94; 257/107; 257/190; 438/478; 438/479; 438/483

(58) Field of Classification Search ......... 117/82–88, 117/92, 94; 257/106, 190; 438/478, 479, 438/483
See application file for complete search history.

(56) References Cited

U.S. PATENT DOCUMENTS

| | | | |
|---|---|---|---|
| 5,290,393 A | 3/1994 | Nakamura | |
| 6,177,292 B1 | 1/2001 | Hong et al. | |
| 6,177,688 B1 | 1/2001 | Linthicum et al. | |
| 6,252,261 B1 | 6/2001 | Usui et al. | |
| 6,468,347 B1 * | 10/2002 | Motoki et al. | 117/89 |
| 6,528,394 B1 | 3/2003 | Lee | |
| 6,611,002 B2 * | 8/2003 | Weeks et al. | 257/94 |
| 6,716,724 B1 | 4/2004 | Iyechika et al. | |
| 6,765,240 B2 * | 7/2004 | Tischler et al. | 257/183 |
| 6,809,351 B2 | 10/2004 | Kuramoto et al. | |
| 6,818,465 B2 * | 11/2004 | Biwa et al. | 438/22 |
| 6,933,213 B2 * | 8/2005 | Lee | 438/478 |
| 6,972,051 B2 * | 12/2005 | Tischler et al. | 117/97 |
| 7,227,189 B2 * | 6/2007 | Biwa et al. | 257/76 |

(Continued)

FOREIGN PATENT DOCUMENTS

JP   2001-294499 A   10/2001

OTHER PUBLICATIONS

Applied Physics Letter, Vol. 53, p. 185, 1988.

(Continued)

Primary Examiner—Robert M Kunemund
Assistant Examiner—G. Nagesh Rao
(74) Attorney, Agent, or Firm—Baker Hostetler, LLP

(57) ABSTRACT

The present invention relates to a freestanding, thick, single crystalline gallium nitride (GaN) film having significantly reduced bending deformation. The inventive GaN film having a crystal tilt angle of C-axis to the <0001> direction per surface distance of 0.0022°/mm exhibits little bending deformation even at a thickness of 1 mm or more, and therefore, is beneficially used as a substrate for a luminescent device.

8 Claims, 5 Drawing Sheets

U.S. PATENT DOCUMENTS

| | | | |
|---|---|---|---|
| 7,233,028 B2* | 6/2007 | Weeks et al. | 257/98 |
| 7,289,089 B2* | 10/2007 | Iwafuchi | 345/82 |
| 7,332,031 B2* | 2/2008 | Tischler et al. | 117/97 |
| 2001/0008656 A1* | 7/2001 | Tischler et al. | 428/34.1 |
| 2001/0055660 A1* | 12/2001 | Tischler et al. | 428/64.1 |
| 2002/0028314 A1* | 3/2002 | Tischler et al. | 428/64.1 |
| 2002/0117681 A1* | 8/2002 | Weeks et al. | 257/106 |
| 2002/0123157 A1* | 9/2002 | Lee | 438/1 |
| 2002/0185660 A1* | 12/2002 | Biwa et al. | 257/200 |
| 2003/0025657 A1* | 2/2003 | Iwafuchi | 345/82 |
| 2006/0032432 A1* | 2/2006 | Tischler et al. | 117/84 |
| 2007/0077674 A1* | 4/2007 | Okuyama et al. | 438/48 |
| 2007/0085087 A1* | 4/2007 | Okuyama et al. | 257/79 |
| 2007/0295985 A1* | 12/2007 | Weeks et al. | 257/103 |
| 2008/0127884 A1* | 6/2008 | Tischler et al. | 117/106 |

OTHER PUBLICATIONS

J. of Crystal Growth, High-quality and crack-free GaN films grown on cracked Si-doped GaN.

* cited by examiner

SINGLE CRYSTALLINE GALLIUM NITRIDE THICK FILM HAVING REDUCED BENDING DEFORMATION

FIELD OF THE INVENTION

The present invention relates to a thick, single crystalline gallium nitride film having a reduced bending deformation, and particularly to a high-quality single crystalline gallium nitride film having a thickness of 1 mm or greater which exhibits little bending deformation, and a method for the preparation thereof.

BACKGROUND OF THE INVENTION

A sapphire/gallium nitride laminate is a useful substrate for a light emitting device (e.g., LED, LD) or other electronic devices, and it has been conventionally prepared by growing gallium nitride on a sapphire substrate by metal organic chemical vapor deposition (MOCVD), hydride vapor phase epitaxy (HVPE), etc. Such a laminate, however, suffers from the problem of bending deformation due to the interfacial strain caused by the differences in the lattice parameter and thermal expansion coefficient between sapphire and gallium nitride, as shown in FIG. 1 (11: sapphire, 12: gallium nitride). The degree of such bending deformation of a sapphire/gallium nitride laminate increases as the thickness of the gallium nitride (GaN) film formed on sapphire increases, adversely affecting the quality and productivity of electronic devices comprising the laminate.

To solve the problem of bending deformation, there have been developed various methods of controlling the GaN/sapphire laminate interfacial state, e.g., a low temperature GaN buffer growth method (U.S. Pat. No. 5,290,393), a PENDEO method using artificially prepared pores (U.S. Pat. No. 6,177,688), an AlN buffer growth method (Applied Physics Letter, Vol. 53, p185, 1988), and an AlN embossing growth method (U.S. Pat. No. 6,528,394). Such interface controlling methods may be applied to the growth of a few to a several tens μm thickness film, but they are not suitable for growing a thick GaN film of several hundred μm thickness due to the generation of cracks (13) on the film influenced by residual strain, as shown in FIG. 2.

In order to inhibit the formation of cracks, EP 1 946 718 and 1 116 827 suggested a method comprising the steps of growing a GaN film (31) on a sapphire substrate (11) to a thickness of several ten or hundred μm, separating the grown film (31) from the substrate so as to remove strain therefrom, and then further growing a separate GaN layer (32) on the separated GaN film, as shown in FIG. 3. However, this method requires the complicated step of removing the substrate, and there still remains some strain on the separated film, which leads to the generation of generating bending deformation or cracks in the grown GaN layer.

Also disclosed in *J. of Crystal Growth, High-quality and crack-free GaN films grown on cracked Si-doped GaN templates*, accepted in 2001, M. Hao et al., is a method of growing a GaN film having little cracks; comprising growing a Si-doped GaN film on a sapphire substrate to a thickness of several μm by metal organic chemical vapor deposition (MOCVD) to induce crack formation on the surface of the GaN film, and then growing a pure GaN layer thereon. However, this MOCVD method has the disadvantage that the film growth rate is too low to obtain a film having a thickness over several hundred μm. Also the interfacial stress derived from the differences in the thermal expansion coefficient and lattice constant between the sapphire substrate and the Si-doped GaN film is not great enough to propagate the cracks formed on the Si-doped GaN layer to the bottom of the sapphire substrate, and therefore, it is difficult to grow a GaN film having a thickness greater than 1 mm.

SUMMARY OF THE INVENTION

Accordingly, it is a primary object of the present invention to provide a thick, freestanding GaN single crystal film having little bending formation even at a thickness of several mm and a novel method for effectively growing such a GaN thick film.

In accordance with one aspect of the present invention, there is provided a single crystalline gallium nitride film having a crystal tilt angle of C-axis to <0001> direction per surface distance of 0.0022°/mm.

In accordance with one aspect of the present invention, there is provided a method of preparing a freestanding, single crystalline gallium nitride (GaN) film comprising the steps of:

i) growing a heavily Si-doped GaN film on a substrate to a thickness of 20 to 50 μm using a hydride vapor phase epitaxy (HVPE) process, to induce the formation of cracks on the film;
  ii) cooling the substrate/heavily Si-doped GaN laminate obtained in step i) to propagate the cracks to the bottom of the substrate;
  iii) growing a GaN film on the crack-containing substrate/heavily Si-doped GaN laminate obtained in step ii) using an HVPE process; and
  iv) removing the crack-containing substrate and heavily Si-doped GaN layer from the crack-containing substrate/Si-heavily doped GaN/GaN film composite obtained in step iii) to obtain the GaN film.

BRIEF DESCRIPTION OF THE DRAWINGS

The above and other objects and features of the present invention will become apparent from the following description thereof, when taken in conjunction with the accompanying drawings which respectively show.

DETAILED DESCRIPTION OF THE INVENTION

The inventive method is characterized in that the growth of a GaN thick film is achieved by growing a heavily Si-doped GaN film on a sapphire substrate using an HVPE process which provides a high growth rate, which induces the generation of artificial cracks faster than that can be achieved by MOCVD. The cracks generated by fast growth of a Si-doped GaN film then propagate to the substrate, which renders the Si-doped layer and substrate vulnerable to the subsequent removal treatment to disintegrate them, to obtain a freestanding GaN film having a thickness of greater than several hundred μm.

Figure 1:
FIG. 1: a schematic view showing the bending deformation occurred in a sapphire/gallium nitride laminate.
Figure 2:
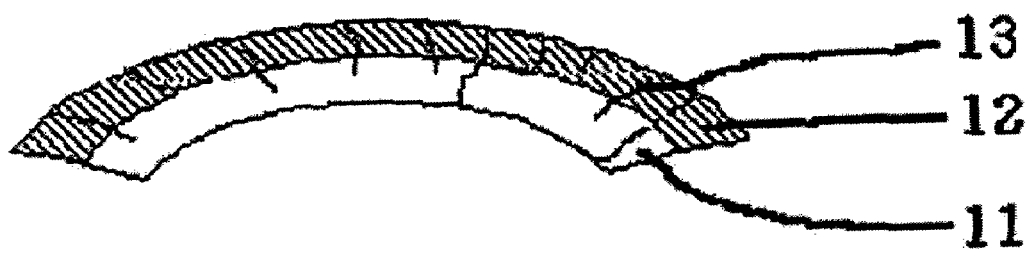
FIG. 2: a schematic view showing cracks generated in a sapphire/gallium nitride laminate.
Figure 3:
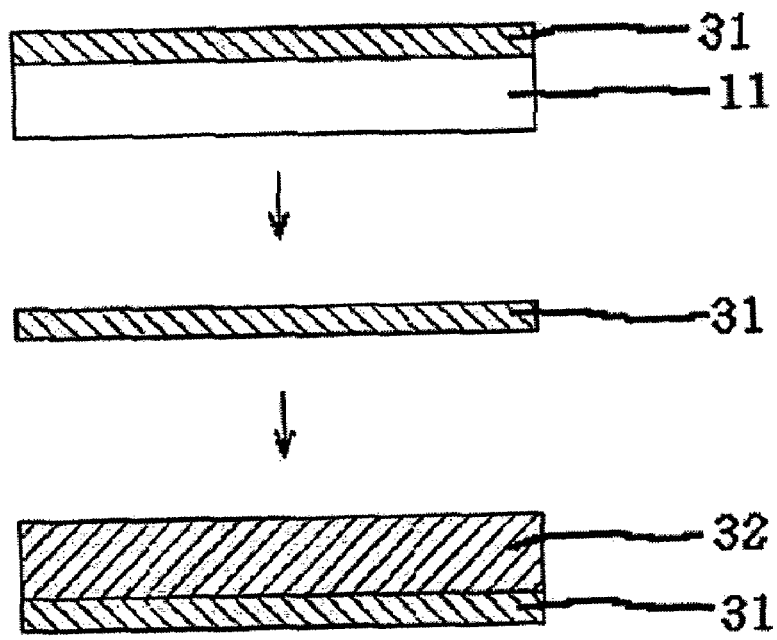
FIG. 3: a schematic view showing the procedure for preparing a GaN thick film according to a prior art method.
Figure 4A:
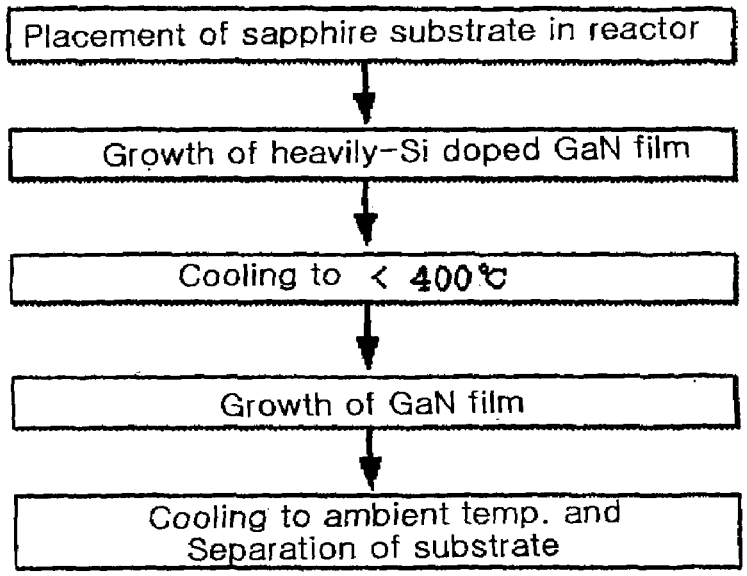
FIGS. 4*a* and 4*b*: a schematic block diagram of the procedure for preparing a GaN thick film according to the present invention.
Figure 4B:
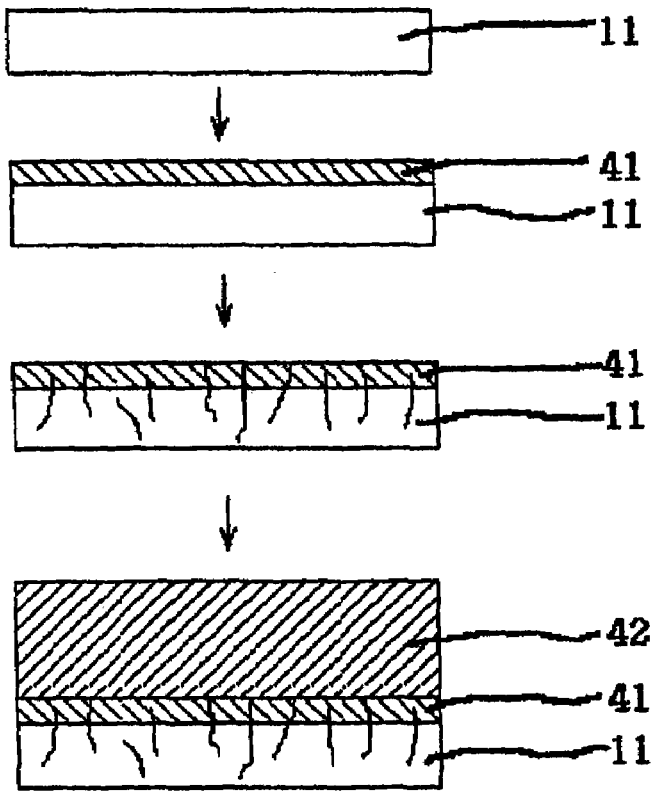

The inventive procedure for preparing a freestanding GaN thick film is schematically shown in FIGS. 4a and 4b. Specifically, a sapphire substrate (11) is placed in a reactor for HVPE, and a heavily Si-doped GaN film (41) is allowed to grow to a thickness that generates cracks. The resulting crack-containing sapphire/gallium nitride laminate is then cooled to 400° C. or below, to allow the cracks to propagate to the bottom of the substrate. Thereafter, a pure GaN film (42) is grown on the crack-containing substrate/Si-doped GaN laminate using an HVPE process, and cooled to ambient temperature, followed by removing the crack-derived substrate (11) and the Si-doped GaN layer (41) from the pure GaN film (42), to obtain the desired freestanding GaN thick film.

In the present invention, the sapphire substrate (11) desirably has a crystal orientation of <0001>, and the HVPE process may be conducted at a growth temperature of 900 to 1100° C. and a growth rate of 10 to 100 μm/h.

If the growth temperature is below 900° C., the mass diffusion at the surface of the growing film becomes unsmoothly, lowering the crystallinity of the grown crystal. Whereas, if the growth temperature is higher than 1100° C., the growth rate becomes slow and the crystallinity of the grown layer becomes poor.

The heavily Si-doped GaN film (41) may be grown by introducing gaseous HCl to a metallic Ga contained in a vessel installed in the reactor for HVPE maintained at a temperature of 600 to 900° C. to generate gaseous GaCl. Meanwhile, ammonia ($NH_3$) gas and a Si-precursor gas such as silane ($SiH_4$) or dichlorosilane ($SiH_2Cl_2$) are led into the reactor, to allow the reactions between GaCl, the Si precursor, and the ammonia gas to take place on the surface of the substrate. The volumetric ratio of the HCl gas, the ammonia gas and the Si-precursor gas may be controlled in the range of 20:30:1 to 70:300:1. The heavily Si-doped GaN film (41) grown on the substrate may have a thickness of 20 to 50 μm and a Si-doping concentration of $5 \times 10^{18}$ to $2 \times 10^{19}$ atoms/cm$^3$.

The crack-formed sapphire/heavily Si-doped GaN laminate is preferably cooled to 200 to 400° C. in a conventional method, to allow the cracks generated in the GaN layer to propagate to the bottom of the substrate, which removes the strain originally present at the interface between the substrate (11) and the GaN film (41) before such a treatment.

The growth of a pure GaN film (42) on the crack-formed substrate/heavily Si-doped GaN laminate may be also conducted by using an HVPE method under growth conditions similar to those described previously until a desired film thickness is obtained.

The removal of the crack-formed substrate/heavily Si-doped GaN layer from the newly formed GaN film (42) to obtain a desired free-standing GaN thick film may be conducted by a conventional method using a laser, e.g., as disclosed in U.S. Pat. No. 6,652,648. At this time, the crack-containing substrate/heavily Si-doped GaN layer is removed in the form of particles having an average size of several hundred μm. The free-standing GaN single crystal thick film thus obtained may have an average diameter of 0.5 to 2 inches and a thickness of 200 to 1500 μm.

The degree of bending deformation of a GaN film may be evaluated by a value which represents the crystal tilt angle of C-axis to the <0001> direction per surface distance, which is calculated from the difference in the center position of (002) X-ray rocking curve peaks measured at the central region of the film and at the edge region apart from the central region by a given distance, in combination with the central angle shift between the two regions. The value of crystal tilt angle represents the incline level of the crystal lattice caused by bending deformation, and therefore, the lower the value, the lower the bending deformation becomes.

In accordance with the present invention, even if a GaN film is grown to a thickness of greater that 1 mm, the GaN film having a low tilt angle of C-axis to the <0001> direction per crystal distance of 0.0022°/mm can be obtained. Besides a GaN film having a <0001> equivalent direction plane, a GaN film having an off-angle surface plane below 7° from (0001) surface plane, as we call 'on-axis surface', may also have a crystal tilt angle of C-axis to the <0001> direction per surface distance of 0.0022°/mm.

The inventive GaN thick film having a greater thickness and much reduced bending deformation, as compared with the prior GaN films can be beneficially used as a substrate for a luminescent device such as an emitting diode.

The present invention is further described and illustrated in the following Examples, which are, however, not intended to limit the scope of the present invention.

EXAMPLE

A sapphire substrate of 2 inch diameter was placed in a reactor for HVPE, and gaseous ammonia ($NH_3$) was introduced into the reactor at 900 to 1100° C. to allow the surface of the substrate to be nitridated. Then, a gaseous mixture (mix ratio=10~30:1 by volume) of ammonia and HCl was introduced into the reactor, followed by re-introducing gaseous ammonia to further nitridate the surface of the substrate again.

Subsequently, an excessive amount of Ga was placed in a Ga-receiving vessel installed in the reactor, and gaseous HCl was introduced into the reactor through an inlet while maintaining the reactor temperature at 600° C. or higher to generate gaseous GaCl. On the other hand, a mixture of ammonia and dichlorosilane ($SiH_2Cl_2$) was led into the reactor through another inlet, to allow the mixture to react gaseous GaCl on the hot surface of the substrate to induce the growth of a heavily Si-doped GaN film to a thickness of 50 μm. This film began to generate cracks at the interface between the substrate and the GaN film. The volume ratio of ammonia, HCl gas, and dichlorosilane used in the above procedure was 20:30:1 to 70:300:1, at a growth temperature of 950 to 1050° C., and the growth rate of the Si-doped GaN film was controlled at 20 to 40 μm/h.

Figure 5:
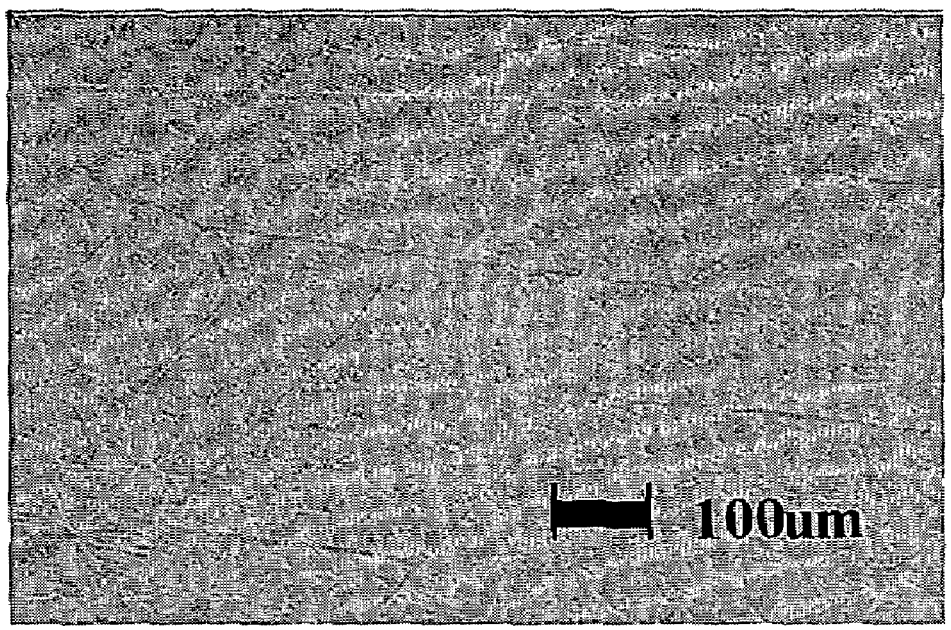
FIG. 5: a microscopic photograph of cracks formed on the heavily Si-doped GaN layer obtained in Example according to the present invention.
Figure 6:
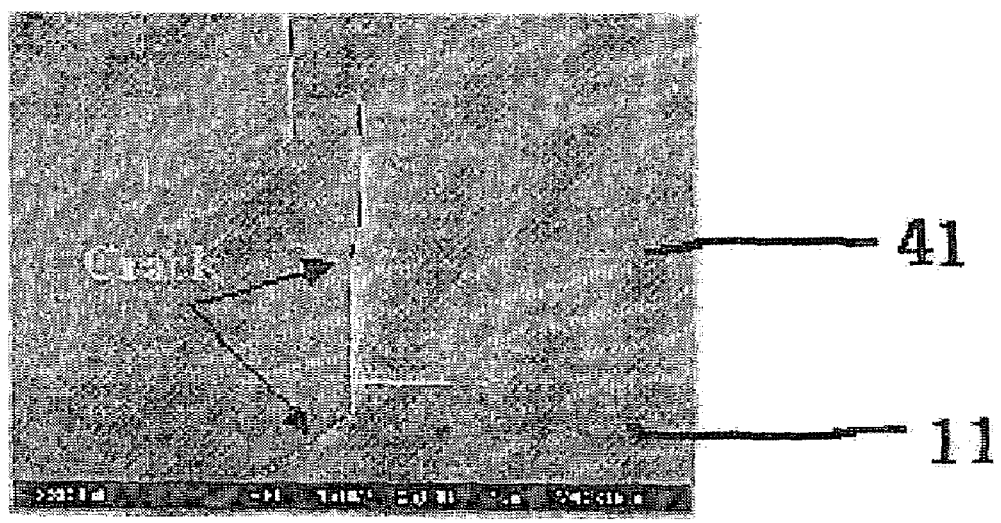
FIG. 6: a microscopic photograph of cracks formed in the sapphire/heavily Si-doped GaN laminate obtained in Example according to the present invention.

A microscopic photograph of the Si-doped GaN layer thus grown is shown in FIG. 5, which illustrates that a number of cracks having an even size distribution of several tens to several hundreds μm were generated on the GaN layer. FIG. 6, a microscopic photograph of the cracks formed in the sapphire/Si-doped GaN laminate, shows that the cracks were present not only in the GaN layer, but also in the sapphire substrate.

Figure 7:
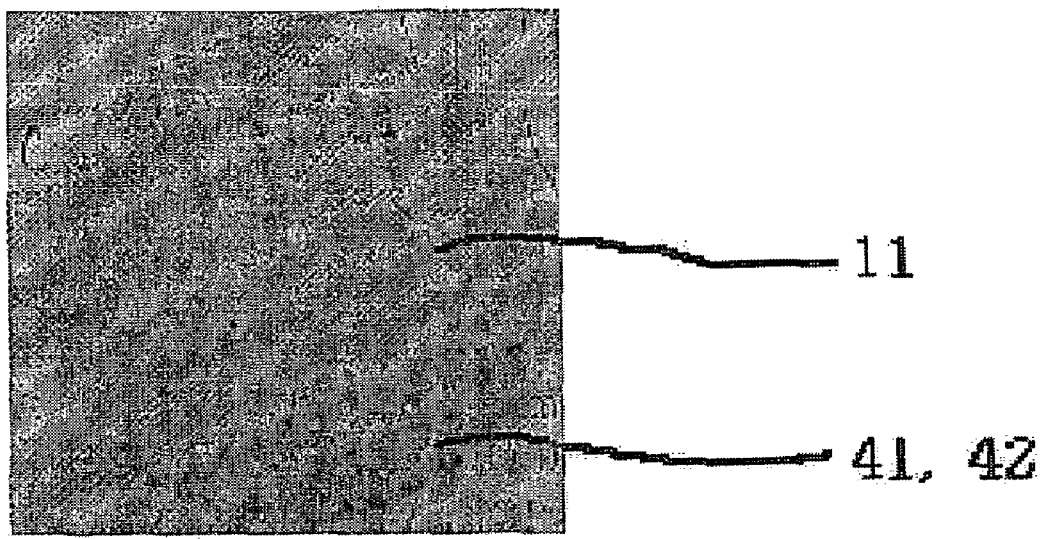
FIG. 7: a microscopic photograph showing the removal of the sapphire substrate and heavily Si-doped GaN layer according to the procedure described in Example of the present invention.
Figure 8:
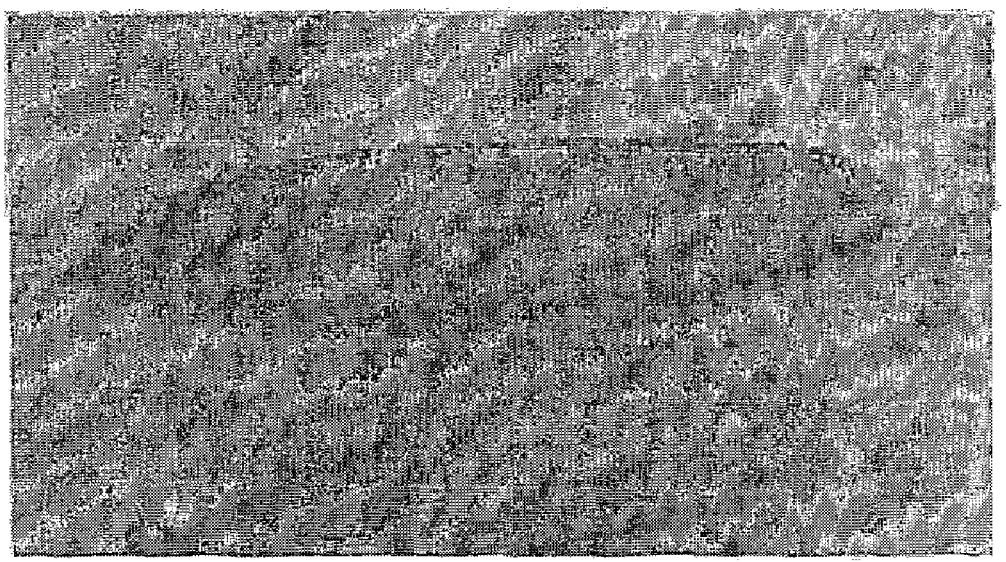
FIG. 8: a microscopic photograph of the freestanding GaN thick film obtained in Example according to the present invention.

Subsequently, the sapphire/Si-doped GaN laminate was cooled to about 400° C. to propagate the cracks to the bottom of the substrate, and then, a pure GaN layer was grown on the Si-doped GaN film using an HVPE process under conditions similar to those described previously, to a thickness of 1 mm. The cracked substrate and Si-doped GaN layer were then removed using a 355 nm Nd:YAG eximer laser, to obtain a free-standing 1 mm thick GaN film. FIG. 7 is a microscopic photograph showing the removal of the sapphire substrate and the Si-doped GaN layer, and FIG. 8, a microscopic photograph of a free-standing, 1 mm thick GaN film thus obtained.

Figure 9:
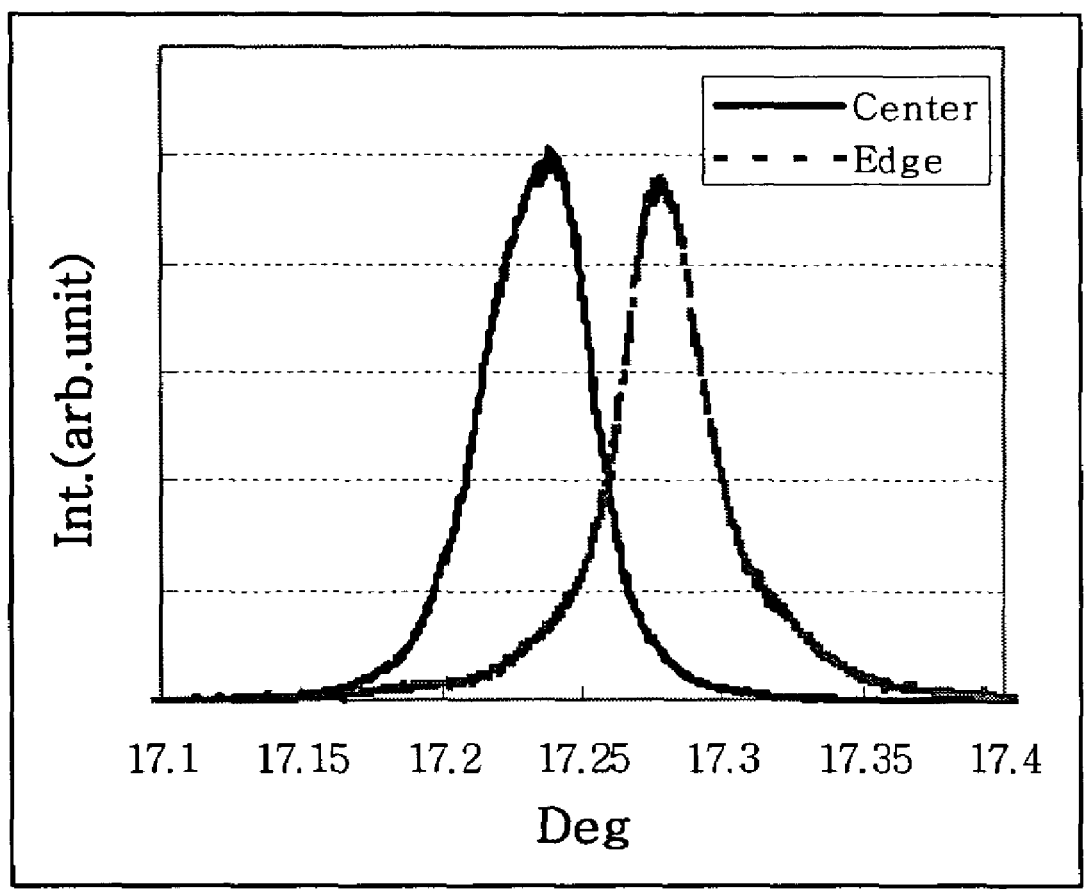
FIG. 9: the results obtained by X-ray diffraction analysis of the GaN thick film of Example according to the present invention.

The freestanding GaN film was analyzed by X-ray diffraction analysis to determine the difference in the half width of the XRD peaks at the central region of the film and the edge region apart from the central region by 18 mm. From the result shown in FIG. 9, it can be seen that the crystal tilt angle at the edge region was 0.039°. That is, the GaN film had a crystal tilt angle of C-axis to <0001> direction per surface distance of 0.0022°/mm, which is much lower than that of any of the prior GaN Films. Further, the respective GaN film had a curvature radius of about 3 m, which is much greater than about 0.5 m of a conventional GaN film. Accordingly, it can be seen that the thick GaN film obtained by the inventive method has a unique characteristic of significantly reduced bending deformation even at a thickness of 1 mm or more.

While some of the preferred embodiments of the subject invention have been described and illustrated, various changes and modifications can be made therein without departing from the spirit of the present invention defined in the appended claims.

What is claimed is:

1. A method of preparing a freestanding, single crystalline gallium nitride (GaN) film comprising the steps of:
    i) growing a heavily Si-doped GaN film on a substrate to a thickness of 20 to 50 μm using a hydride vapor phase epitaxy (HVPE) process, to induce the formation of cracks on the film;
    ii) cooling the substrate/heavily Si-doped GaN laminate obtained in step i) to propagate the cracks to the bottom of the substrate;
    iii) growing a GaN film on the crack-containing substrate/heavily Si-doped GaN laminate obtained in step ii) using an HVPE process; and
    iv) removing the crack-containing substrate and heavily Si-doped GaN layer from the crack-containing substrate/Si-heavily doped GaN/GaN film composite obtained in step iii) to obtain the GaN film,
    wherein the single crystalline gallium nitride film has a crystal tilt angle of C-axis to <0001> direction per surface crystal distance of 0.0022°/mm.

2. The method of claim 1, wherein the substrate is sapphire.

3. The method of claim 1, wherein in step i), the heavily Si-doped GaN film is grown by introducing HCl gas to a vessel containing a metallic Ga and maintained at an HVPE reaction temperature of 600 to 900° C. to generate gaseous GaCl, while separately introducing ammonia ($NH_3$) gas and a Si-precursor gas into the reactor, to allow the reactions between GaCl, the Si precursor, and the ammonia gas to occur on the surface of the substrate.

4. The method of claim 3, wherein the HCl gas, the ammonia gas and the Si-precursor gas are employed in a volume ratio of 20:30:1 to 70:300:1.

5. The method of claim 1, wherein the heavily Si-doped GaN film has a Si-doping concentration of $5 \times 10^{18}$ to $2 \times 10^{19}$ atoms/cm$^3$.

6. The method of claim 1, wherein the HVPE process in step i) or iii) is conducted at a GaN film growth temperature of 900 to 1100° C.

7. The method of claim 6, wherein the HVPE process is conducted at a GaN film growth rate of 10 to 100 μm/h.

8. The method of claim 1, wherein in step ii), the laminate is cooled to 200 to 400° C.

* * * * *

UNITED STATES PATENT AND TRADEMARK OFFICE
CERTIFICATE OF CORRECTION

PATENT NO. : 7,621,998 B2 Page 1 of 1
APPLICATION NO. : 11/286219
DATED : November 24, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 817 days.

Signed and Sealed this

Twenty-sixth Day of October, 2010

David J. Kappos
*Director of the United States Patent and Trademark Office*